United States Patent
Moon et al.

(10) Patent No.: US 9,837,608 B2
(45) Date of Patent: Dec. 5, 2017

(54) MASK ASSEMBLY AND APPARATUS AND METHOD OF MANUFACTURING DISPLAY APPARATUS USING THE SAME

(71) Applicant: Samsung Display Co., Ltd., Yongin-si (KR)

(72) Inventors: Youngmin Moon, Yongin-si (KR); Minho Moon, Yongin-si (KR); Sungsoon Im, Yongin-si (KR); Soonchul Chang, Yongin-si (KR); Kyuhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/175,640

(22) Filed: Jun. 7, 2016

(65) Prior Publication Data

US 2017/0141314 A1    May 18, 2017

(30) Foreign Application Priority Data

Nov. 12, 2015    (KR) .................. 10-2015-0159004

(51) Int. Cl.
| | |
|---|---|
| *H01L 21/00* | (2006.01) |
| *H01L 51/00* | (2006.01) |
| *H01L 51/52* | (2006.01) |
| *H01L 51/56* | (2006.01) |
| *C23C 14/04* | (2006.01) |
| *C23C 14/24* | (2006.01) |

(52) U.S. Cl.
CPC ........ *H01L 51/0011* (2013.01); *C23C 14/042* (2013.01); *C23C 14/24* (2013.01); *H01L 51/0023* (2013.01); *H01L 51/5237* (2013.01); *H01L 51/56* (2013.01)

(58) Field of Classification Search
CPC . H01L 51/0011; H01L 51/0023; H01L 51/56; B05B 15/0481; C23C 14/042; C23C 14/24; C23C 14/34
USPC .......................................................... 438/46
See application file for complete search history.

(56) References Cited

U.S. PATENT DOCUMENTS

| | | | |
|---|---|---|---|
| 2003/0054646 A1 | 3/2003 | Yotsuya | |
| 2007/0072337 A1* | 3/2007 | Matsuzaki | ............ C23C 14/042 438/99 |
| 2012/0266813 A1* | 10/2012 | Hong | .................... C23C 14/044 118/505 |

FOREIGN PATENT DOCUMENTS

| | | |
|---|---|---|
| JP | 2007-152613 | 6/2007 |
| KR | 10-2003-0025815 | 3/2003 |
| KR | 10-2005-0083421 | 8/2005 |
| KR | 10-2007-0002553 | 1/2007 |

* cited by examiner

*Primary Examiner* — Whitney T Moore
*Assistant Examiner* — Herve Assouman
(74) *Attorney, Agent, or Firm* — H.C. Park & Associates, PLC

(57) ABSTRACT

A mask assembly includes: a mask frame; and a mask sheet disposed on the mask frame, wherein the mask sheet is stretched by applying tensile force and affixed onto the mask frame, wherein the mask sheet includes a pattern including a plurality of openings, and wherein a thickness of the pattern is different from thicknesses of other portions of the mask sheet.

12 Claims, 6 Drawing Sheets

MASK ASSEMBLY AND APPARATUS AND METHOD OF MANUFACTURING DISPLAY APPARATUS USING THE SAME

CROSS-REFERENCE TO RELATED APPLICATION

This application claims priority from and the benefit of Korean Patent Application No. 10-2015-0159004, filed on Nov. 12, 2015, which is hereby incorporated by reference for all purposes as if fully set forth herein.

BACKGROUND

Field

Exemplary embodiments relate to mask assembly apparatuses and methods. More particularly, exemplary embodiments relate to a mask assembly, and an apparatus and method of manufacturing a display apparatus using the mask assembly.

Discussion of the Background

Recently, electronic devices have been made portable, including tablet personal computers (PCs) and small electronic devices such as mobile phones.

A portable electronic device includes a display apparatus in order to support various functions or provide a user with visual information, such as an image or a moving image. As size of components for driving display apparatuses have decreased, the importance of the display apparatuses in electronic devices has increased. Also, the display apparatus may have a structure for bending from a flat state to a certain angle.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask assembly, and an apparatus and method of manufacturing a display apparatus using the same.

Additional aspects will be set forth in the detailed description which follows, and, in part, will be apparent from the disclosure, or may be learned by practice of the inventive concept.

An exemplary embodiment discloses a mask assembly including: a mask frame; and a mask sheet disposed on the mask frame, wherein the mask sheet is stretched by applying tensile force and affixed onto the mask frame, wherein the mask sheet includes a pattern including a plurality of openings, and wherein a thickness of the pattern is different from thicknesses of other portions of the mask sheet.

An exemplary embodiment also discloses an apparatus for manufacturing a display apparatus including: a mask assembly disposed facing a substrate; and a deposition source disposed facing the mask assembly, wherein the mask assembly includes: a mask frame; and a mask sheet disposed on the mask frame, wherein the mask sheet is stretched by applying tensile force and affixed onto the mask frame, wherein the mask sheet includes a pattern including a plurality of openings, and wherein a thickness of the pattern is different from thicknesses of other portions of the mask sheet.

An exemplary embodiment further discloses a method of manufacturing a display apparatus including: transferring a substrate and a mask assembly into a chamber; aligning the substrate and the mask assembly relative to each other; and depositing a deposition material onto the substrate, wherein the deposition material is provided from a deposition source facing the mask assembly, and the deposition material is deposited through the mask assembly, wherein the mask assembly includes a mask frame and a mask sheet disposed on the mask frame, wherein the mask sheet is stretched by applying tensile force and affixed onto the mask frame, wherein the mask sheet includes a pattern including a plurality of openings, and wherein a thickness of the pattern is different from thicknesses of other portions of the mask sheet.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
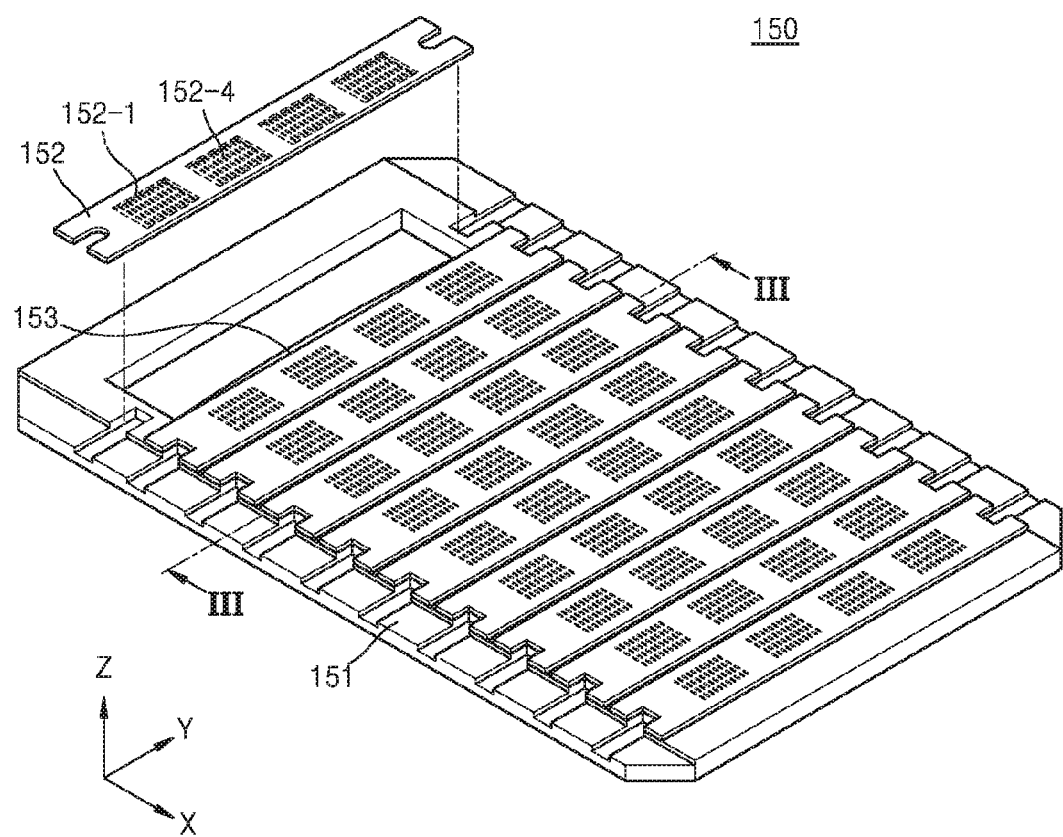
FIG. 1 is a perspective view of a mask assembly according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
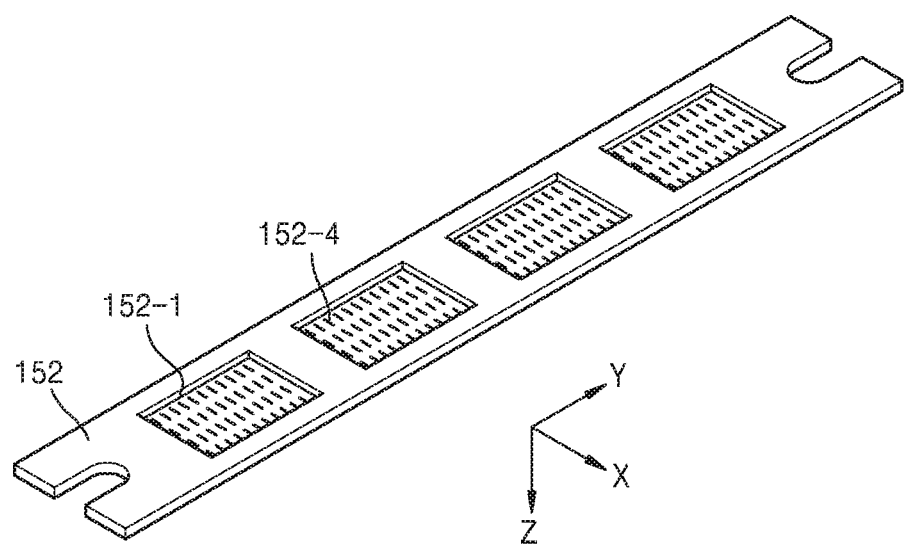
FIG. 2 is a perspective view of a mask sheet of FIG. 1, according to one or more exemplary embodiments.
Figure 3:
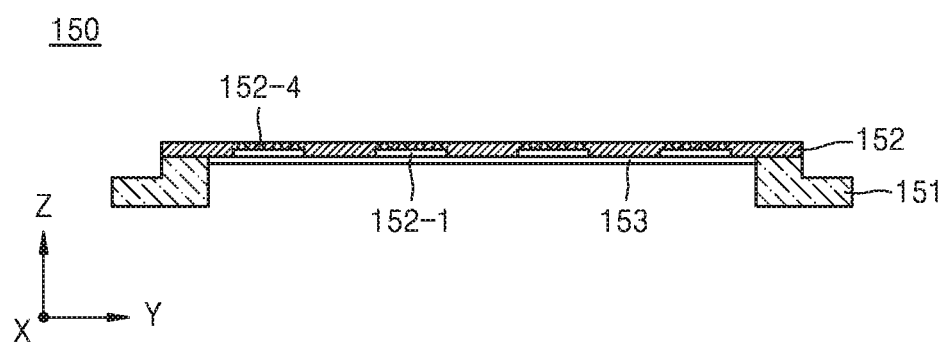
FIG. 3 is a cross-sectional view taken along a sectional line III-III of FIG. 1, according to one or more exemplary embodiments.

FIG. 1 is a perspective view of a mask assembly 150 according to one or more exemplary embodiments. FIG. 2 is a perspective view of a mask sheet 152 of FIG. 1, according to one or more exemplary embodiments. FIG. 3 is a cross-sectional view taken along a sectional line III-III of FIG. 1, according to one or more exemplary embodiments.

Referring to FIGS. 1, 2, and 3, the mask assembly 150 may include a mask frame 151, mask sheets 152, and a reinforcement member 153. The mask frame 151 may have a structure of multiple frames connected to each other. The mask frame 151 may also be formed in an integrated plate. A center of the mask frame 151 may be open.

The mask sheet 152 may have a plate form or an elongated plate (hereinafter, stick) form and may be disposed on the mask frame 151. The mask sheet 152 having the plate form may be disposed on the mask frame 151 to cover the entire mask frame 151. The mask sheets 152 having the stick form may be disposed on the mask frame 151 adjacent to one another. Hereinafter, a plurality of mask sheets 152 having the stick form will be described for description purpose, but the exemplary embodiments are not limited thereto.

The mask sheet 152 may include a pattern 152-1 including openings 152-4 disposed in a group to form a certain pattern. The pattern 152-1 may correspond to a display apparatus and/or a display area to be formed.

A thickness of the pattern 152-1 may be different from a thickness of other portions of the mask sheet 152. That is, the thickness of the pattern 152-1 may be less than the thickness of the other portions of the mask sheet 152. The thicknesses of the pattern 152-1 and the mask sheet 152 may be measured in a direction perpendicular to a lengthwise direction of the mask sheet 152. For example, the thicknesses of the pattern 152-1 and the mask sheet 152 may be measured in a direction (e.g., a Z direction of FIG. 1) perpendicular to both a long side and a short side of the mask sheet 152.

The mask sheet 152 may include multiple patterns 152-1, and each of the patterns 152-1 may be disposed spaced apart from one another on the mask sheet 152. For example, the patterns 152-1 may be arranged spaced apart from one another in the lengthwise direction (e.g., a Y direction of FIG. 1) of the mask sheet 152.

The patterns 152-1 may be formed by a chemical etching, a laser patterning, and/or the like. According to one or more exemplary embodiments, the patterns 152-1 may be formed by chemical etching, by disposing a first photoresist on the mask sheet 152 exposing a portion of the mask sheet 152 corresponding to the pattern 152-1, and chemically etching the mask sheet 152 with an etching solution. Then, after removing the first photoresist, the openings 152-4 may be formed by disposing a second photoresist on the mask sheet 152 exposing a portion of the mask sheet 152 corresponding to shapes of openings 152-4 of the patterns 152-1, and chemically etching the openings 152-4 through the above-described process.

In one or more exemplary embodiments, the patterns 152-1 may be formed by laser patterning, and the openings 152-4 of the patterns 152-1 may be formed by laser patterning. For example, protection layers may be disposed during the above laser patterning processes. The protection layers may be configured to expose portions of the mask sheet 152 corresponding to the pattern 152-1, and/or the pattern 152-1, respectively.

According to one or more exemplary embodiments, the patterns 152-1 may formed through chemical etching, and the openings 152-4 may be formed by laser patterning. Furthermore, the patterns 152-1 may be formed by laser patterning, and the openings 152-4 may be formed through chemical etching.

The mask sheet 152 may be affixed to the mask frame 151 while applying tensile force to the mask sheet 152. The mask sheet 152 may be affixed to the mask frame 151 through welding, etc.

When the tensile force is applied to the mask sheet 152 while the mask sheet 152 is affixed to the mask frame 151, stress from the tensile force may be concentrated on the openings 152-4 of the patterns 152-1 while the mask sheet 152 extends if the portion of the mask sheet 152, in which the pattern 152-1 is formed, has the same thickness as the others of the mask sheet 152. Thus, cracks may occur in the openings 152-4, and/or a distance between the openings 152-4 may be altered such that gaps between the openings 152-4 may become inconsistent. According to one or more exemplary embodiments, the thickness of the entire pattern 152-1 is less than the thicknesses of the other portions of the mask sheet 152, and therefore, concentration of the stress on the openings 152-4 may be reduced or prevented. In addition, since the patterns 152-1 may be stretched easier than the other portions of the mask sheet 152 when the mask sheet 152 is extended, and therefore, distances between the adjacent openings 152-4 may still be maintained consistent so that gaps between the adjacent openings 152-4 may be maintained similar to each other. Therefore, according to one or more exemplary embodiments, although the distances between the adjacent openings 152-4 may be increased than initial distances when the mask sheet 152 is stretched, the distances between the adjacent openings 152-4 may increase at a certain ratio, and therefore, the pattern of the openings 152-4 may be preserved.

The reinforcement member 153 is disposed on the mask frame 151 and may reduce or prevent a deformation of the mask frame 151. The reinforcement member 153 may be disposed in the center of the mask frame 151 in any one of a long-side direction or a short-side direction of the mask frame 151.

The reinforcement member 153 may be in a plate form, a bar form, or the like and may be disposed on the mask frame 151. For example, the reinforcement member 153 may have a grid form and may be disposed between the mask frame 151 and the mask sheet 152. Hereinafter, the reinforcement member 153 having a bar form disposed on the mask frame 151 will be described for description purpose, but the exemplary embodiments are not limited thereto.

The reinforcement member 153 may be disposed between the adjacent mask sheets 152. Accordingly, the reinforcement member 153 may reduce or prevent a deposition material from flowing between the adjacent mask sheets 152 during deposition process. Therefore the pattern of the openings 152-4 of the mask assembly 150 may be maintained after the mask sheet 152 is installed on the mask frame 151, and therefore, the deposition material may be deposited according to a designed pattern.

The mask frame, the mask sheet, and the support member may be formed of an Invar material having a low thermal expansion coefficient, in addition to SUS. For example, the Invar material may include an Invar having a nickel content in a range of 32 wt % to 46 wt % and containing iron and an Invar having a nickel content of 32 wt % and a cobalt (Co) content of 5 wt % and containing iron.

Figure 4:
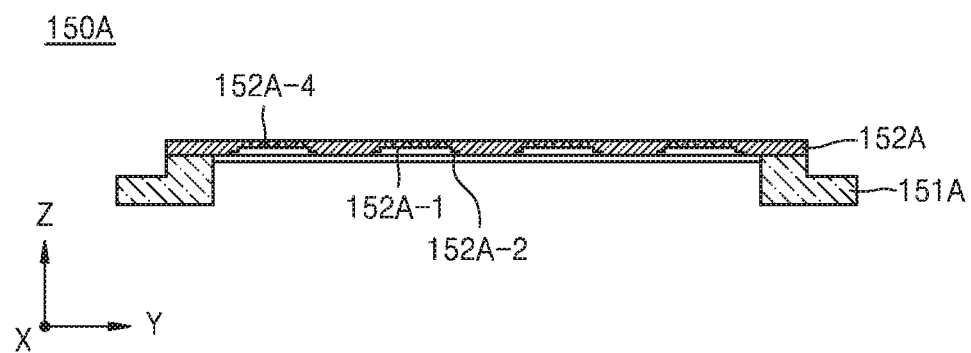
FIG. 4 is a cross-sectional view of a mask assembly, according to one or more exemplary embodiments.

FIG. 4 is a cross-sectional view of a mask assembly 150A, according to one or more exemplary embodiments.

Referring to FIG. 4, a mask sheet 152A may include a pattern 152A-1 including openings 152A-4 disposed in a pattern and a step structure 152A-2 connected to the pattern 152A-1. The pattern 152A-1 and the step structure 152A-2 may have smaller thicknesses than other portions of the mask sheet 152A.

Various methods may be used to form the pattern 152A-1 and the step structure 152A-2. The mask sheet 152A may be initially formed in a plate form. Then, a first photoresist may be disposed on the mask sheet 152A. In this case, the first photoresist may be configured to expose portions of the mask sheet 152A corresponding to the pattern 152A-1. Then, the etching solution may be sprayed onto the mask sheet 152A, or the mask sheet 152A may be soaked in the etching solution. In this case, the first photoresist may be disposed onto a rear surface of the mask sheet 152A, on which the pattern 152A-1 is not formed.

The etching solution may contact a portion of the mask sheet 152A that is exposed by the first photoresist, and may etch the exposed portion of the mask sheet 152A. In this case, a thickness of the etched mask sheet 152A may differ according to a time that the etching solution contacts the exposed portion of the mask sheet 152A. After the mask sheet 152A is etched, a thickness of the pattern 152A-1 may be less than thicknesses of other portions of the mask sheet 152A.

Subsequently, the first photoresist may be removed from the mask sheet 152A. Then, a second photoresist is disposed on the mask sheet 152A, the second photoresist configured to expose a portion of the mask sheet 152A corresponding to the step structure 152A-2 and the pattern 152A-1, and the above etching processes may be repeated. In this case, the thickness of the pattern 152A-1 may have a thickness less than an initial thickness due to the at least two etching processes, and a thickness of the step structure 152A-2 may be less than the thicknesses of the other portions of the mask sheet 152A. Therefore, the step structure 152A-2 and the pattern 152A-1 may be sequentially stepped as stairs. That is, the thickness of the step structure 152A-2 may be greater than that of the pattern 152A-1, but may be less than the thicknesses of the other portions of the mask sheet 152A which are not etched.

According to one or more exemplary embodiments, the pattern 152A-1 is formed through etching, and the step structure 152A-2 may be formed by laser patterning. In this case, the step structure 152A-2 may be formed by the laser patterning which includes radiating a laser beam onto a portion of the mask sheet 152A corresponding to the step structure 152A-2 to thereby form the step structure 152A-2.

According to one or more exemplary embodiments, both the pattern 152A-1 and the step structure 152A-2 may be formed by the laser patterning. In this case, the pattern 152A-1 and the step structure 152A-2 may have different thickness according to various factors such as, but not limited to, a radiation time of the laser beam onto the mask sheet 152A and an intensity of the laser beam.

According to one or more exemplary embodiments, the pattern 152A-1 may be formed by the laser patterning, and the step structure 152A-2 may be formed through chemical etching. In this case, the pattern 152A-1 may be formed by the laser patterning and the step structure 152A-2 may be formed through chemical etching process that is same as or similar to the previously described the laser patterning and the chemical etching, and thus detailed descriptions thereof will be omitted.

The mask sheet 152A may be affixed onto a mask frame 151A to form a mask assembly 150A. In this case, the mask sheet 152A may be affixed onto the mask frame 151A by the method same as or similar to the previously described method, and thus, detailed descriptions thereof will be omitted.

The mask sheet 152A may be disposed on the mask frame 151A while applying tensile force to the mask sheet 152A. In this case, when tensile force is applied to the mask sheet 152A as described above, the pattern 152A-1 and the step structure 152A-2 may reduce a deformation of a pattern of the openings 152A-4. In particular, since the pattern 152A-1 and the step structure 152A-2 have step difference in the respective thicknesses, the pattern 152A-1 and the step structure 152A-2 may reduce the deformation of the pattern of the openings 152A-4.

The mask sheet 152A may include at least one step structure 152A-2. In this case, when the mask sheet 152A includes multiple step structures 152A-2, the step structures 152A may be sequentially connected from the pattern 152A-1. Also, thicknesses of the step structures 152A-2 may sequentially increase away from the pattern 152A-1. Hereinafter, for convenience, an exemplary embodiment including two step structures will be described with respect to FIG. 5.

Figure 5:
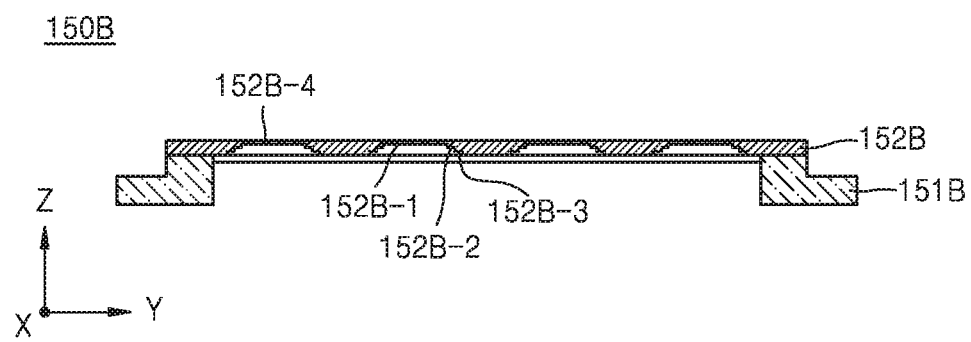
FIG. 5 is a cross-sectional view of a mask assembly, according to one or more exemplary embodiments.

FIG. 5 is a cross-sectional view of a mask assembly 150B, according to one or more exemplary embodiments.

Referring to FIG. 5, a mask sheet 152B may include a pattern 152B-1, a first step structure 152B-2, and a second step structure 152B-3. In this case, since the pattern 152B-1 is the same as or similar to the previously described pattern 152A-1, the detailed descriptions thereof will be omitted.

The first step structure 152B-2 may be connected to the pattern 152B-1. Also, the second step structure 152B-3 may be connected to the first step structure 152B-2. In this case, a thickness of the first step structure 152B-2 may be different from that of the second step structure 152B-3. For example, the thickness of the first step structure 152B-2 may be less than that of the second step structure 152B-3. Also, the thickness of the first step structure 152B-2 may be greater than that of the pattern 152B-1. Therefore, the thicknesses of the pattern 152B-1, the first step structure 152B-2, and the second step structure 152B-3 may be greater in this order.

At least one of the pattern 152B-1, the first step structure 152B-2, and the second step structure 152B-3 may be formed by a chemical etching and/or a laser patterning.

The mask sheet 152B may include the pattern 152B-1, the first step structure 152B-2, and the second step structure 152B-3 that may be sequentially stepped as stair structures. In this case, the pattern 152B-1, the first step structure 152B-2, and the second step structure 152B-3 may be sequentially formed in a lengthwise direction of the mask sheet 152B. Then, the openings 152B-4 may be formed in the pattern 152B-1 in a pattern.

The mask sheet 152B may be disposed on the mask frame 151B while applying tensile force to a mask frame 151B, and form a mask assembly 150B. In this case, as described above, the pattern 152B-1, the first step structure 152B-2, and the second step structure 152B-3 may reduce the tensile force applied to the mask sheet 152B when the mask sheet 152B is stretched. In detail, the pattern 152B-1, the first step structure 152B-2, and the second step structure 152B-3 may reduce or prevent a deformation of the pattern of the openings 152B-4 from an initial pattern thereof, due to the deformation of the pattern caused by change of lengths of the openings 152B-4 when tensile force is applied to the mask sheet 152B.

Figure 6:
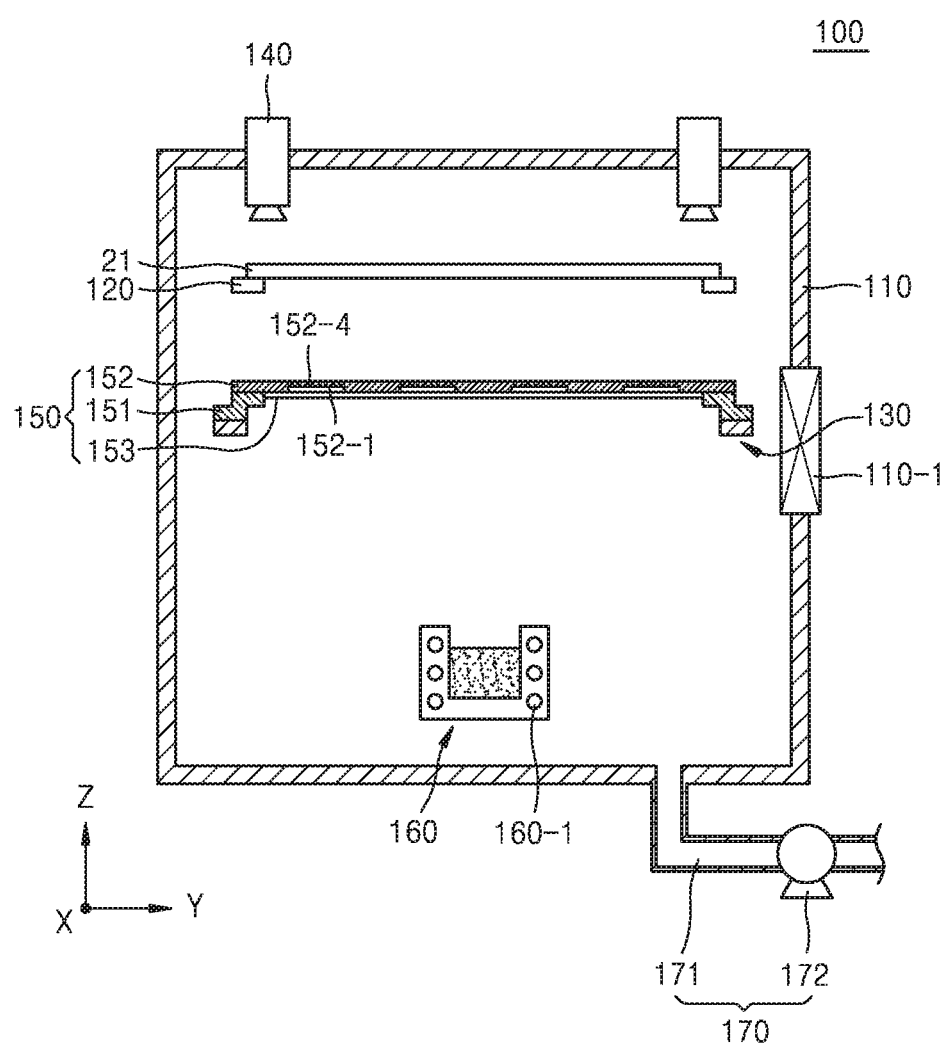
FIG. 6 is a cross-sectional view of an apparatus for manufacturing a display apparatus using the mask assembly of FIG. 1, according to one or more exemplary embodiments.

FIG. 6 is a cross-sectional view of an apparatus 100 for manufacturing a display apparatus using the mask assembly 150 of FIG. 1, according to one or more exemplary embodiments.

Referring to FIG. 6, the apparatus 100 for manufacturing a display apparatus may include the mask assembly 150, a deposition source 160, a substrate supporter 120, a mask assembly supporter 130, a suction part 170, a vision unit 140, and a chamber 110.

The mask assembly 150 may include the mask frame 151 and the mask sheet 152. In this case, the mask sheet 152 may be formed through the same or similar process described with reference to FIGS. 1, 2, 3, and 4. Hereinafter, for convenience, the mask assembly 150 including the mask sheet 152 illustrated in FIG. 1 will be described.

The deposition source 160 may include a deposition material. The deposition material may be sublimated or evaporated from the deposition source 160, and may include at least one of an inorganic material, a metal, and an organic material.

The deposition source 160 may be disposed facing the mask frame 151, and a portion of the deposition source 160 facing the mask frame 151 may be open. Also, the deposition source 160 may include a heater 160-1 for applying heat to the deposition material.

The substrate supporter 120 may support a substrate 21. The substrate supporter 120 may have various shapes. For example, the substrate supporter 120 may include a shuttle, an electrostatic chuck, an adhesive chuck, or the like disposed in the chamber 110. The substrate supporter 120 may also include a support frame. Hereinafter, for convenience, the substrate supporter 120 includes the support frame.

The deposition material may be deposited onto regions of the substrate 21 spaced apart from each other. The patterns 152-1 may be disposed spaced apart from each other on the mask sheet 152. The substrate 21 may be divided into multiples after the deposition is completed, and thus, a plurality of display apparatuses may be formed. According to one or more exemplary embodiments, the deposition material may be deposited on the entire substrate 21. In this case, the patterns 152-1 may be formed on the entire mask sheet 152. The substrate 21 may be used to form one display apparatus. Hereinafter, the deposition material deposited onto the regions of the substrate 21 which are spaced apart from each other will be described for convenience.

The mask assembly supporter 130 may be disposed between the substrate supporter 120 and the deposition source 160. The mask assembly 150 may be disposed onto the mask assembly supporter 130, and the mask assembly supporter 130 may support the mask assembly 150. A position of the mask assembly 150 may be adjusted to align the mask assembly 150 and the substrate 21 with each other.

The suction part 170 may be connected to the chamber 110 and may consistently maintain an internal pressure of the chamber 110. The suction part 170 may include a connection pipe 171 connected to the chamber 110 and a pump 172 connected to the connection pipe 171.

The vision unit 140 may include a camera. The vision unit 140 captures locations of the substrate 21 and the mask assembly 150, and may provide data necessary to align the substrate 21 with respect to the mask assembly 150.

The chamber 110 may have internal space, and a portion of the chamber 110 may include an opening. For example, a gate valve 110-1 may be installed on the opening of the chamber 110, and thus the opening of the chamber 110 may be opened or closed.

Regarding the operation of the apparatus 100 for manufacturing a display apparatus, the gate valve 110-1 is opened to open the chamber 110. The suction part 170 may control the internal pressure of the chamber 110 to be similar to atmospheric pressure.

When the gate valve 110-1 is open, the substrate 21 and the mask assembly 150 may be transferred from the outside of the chamber 110 to the inside thereof. The substrate 21 and the mask assembly 150 may be transported by a robot arm, a shuttle, etc.

After the substrate 21 and the mask assembly 150 are transported to the inside of the chamber 110, the chamber 110 is closed by operating the gate valve 110-1, and the suction part 170 operates to control the internal pressure of the chamber 110 to a near vacuum state. The deposition material is evaporated or sublimated from the deposition source 160 and may be deposited onto the substrate 21 through the mask assembly 150. Accordingly, the deposition material may be deposited through the openings 152-4 of the mask sheet 152 and onto the substrate 21 according to the pattern 152-1.

As described above, the thickness of the pattern region 152-1 may be less than a thickness of other portion of the mask sheet 152. Accordingly, when the tensile force is applied to the mask sheet 152, the pattern of the openings 152-4 may be maintained such that the deposition material may be deposited on the substrate 21 in a consistent pattern. Also, according to the mask sheet 152 including the pattern 152-1 and the step structure 152-2, the deposition material may be deposited onto the substrate 21 through the same or similar process as described above.

Therefore, the apparatus 100 for manufacturing a display apparatus may deposit the deposition material onto the substrate 21 in the consistent pattern. Accordingly, the apparatus 100 may manufacture a display apparatus having improved performance. Moreover, the apparatus 100 for manufacturing a display apparatus may repeatedly deposit the deposition material onto multiple regions of the substrate 21 in a consistent pattern, a defect ratio may be reduced during the manufacture of a display apparatus.

Figure 7:
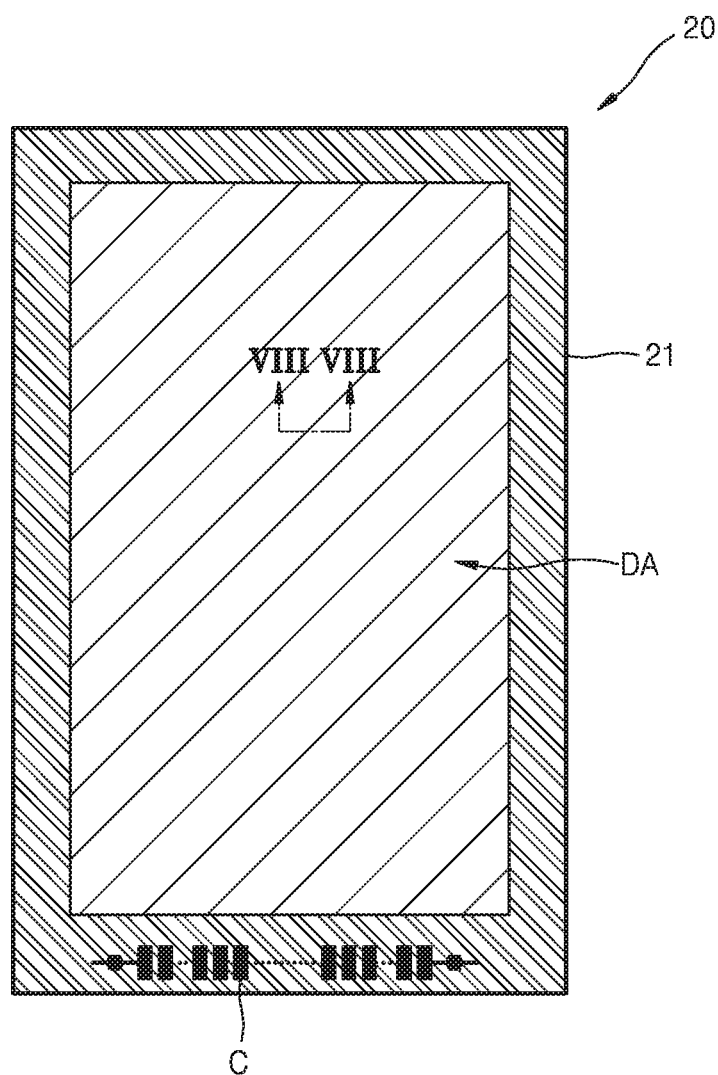
FIG. 7 is a plan view of a display apparatus manufactured by the apparatus of FIG. 6, according to one or more exemplary embodiments.
Figure 8:
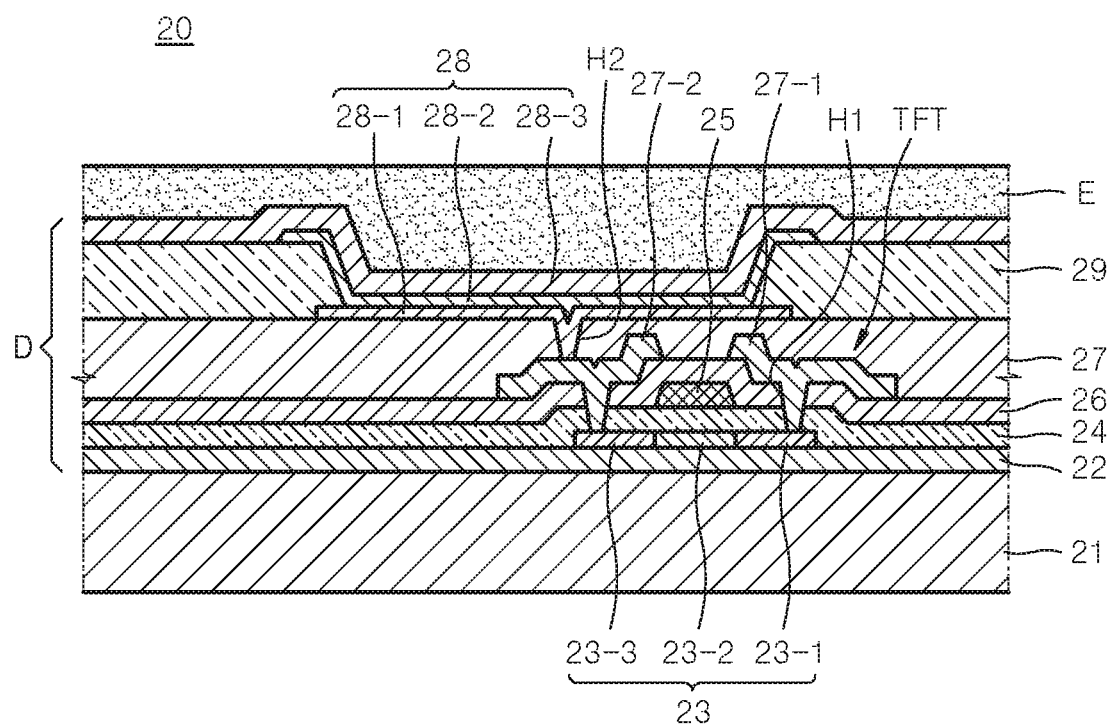
FIG. 8 is a cross-sectional view taken along a sectional line VIII-VIII of FIG. 7, according to one or more exemplary embodiments.

FIG. 7 is a plan view of a display apparatus 20 manufactured by the apparatus 100 of FIG. 6, according to one or more exemplary embodiments. FIG. 8 is a cross-sectional view taken along a sectional line VIII-VIII of FIG. 7, according to one or more exemplary embodiments.

Referring to FIGS. 7 and 8, the display apparatus 20 may include a display area DA and a non-display area on an outer portion of the display area DA disposed or defined on the substrate 21. A light-emitting area D is arranged in the display area DA, and wires such as a power wires may be arranged in the non-display area. Also, a pad area C may be arranged in the non-display area.

The display apparatus 20 may include the substrate 21 and the light-emitting area D disposed on the substrate 21. The display apparatus 20 may include a thin-film encapsulation layer E disposed on the light-emitting area D. The substrate 21 may include plastic and/or a metallic material such as stainless steel (SUS) or titanium (Ti). The substrate 21 may include polyimide (PI). Hereinafter, the substrate 21 including PI is described for convenience.

The light-emitting area D may be disposed on the substrate 21. The light-emitting area D may include a thin film transistor TFT, a passivation layer 27 surrounding the thin film transistor TFT, and a light-emitting device 28 formed on the passivation layer 27.

The substrate 21 may include a glass material, but the substrate 21 is not limited thereto. The substrate 21 may include plastics or a metallic material such as SUS or Ti. The substrate 21 may also include PI. Hereinafter, the substrate 21 including a glass material is described for convenience.

A buffer layer 22 including an organic compound and/or an inorganic compound may be further disposed on the substrate 21 and may include silicon oxide $SiO_x$ ($x \geq 1$) and silicon nitride $SiN_x$ ($X \geq 1$).

An active layer 23 is disposed having a certain pattern on the buffer layer 22, and the gate insulating layer is disposed covering the active layer 23. The active layer 23 includes a source area 23-1, a drain area 23-3, and a channel area 23-2 disposed between the source area 23-1 and the drain area 23-3.

The active layer 23 may include various materials. For example, the active layer 23 may include an inorganic semiconductor material such as amorphous silicon, crystalline silicon, and/or an oxide semiconductor, and an organic semiconductor material. Hereinafter, the active layer 23 including amorphous silicon is described for convenience.

The active layer 23 may be formed by disposing an amorphous silicon layer on the buffer layer 22, crystallizing the amorphous silicon layer into a crystalline silicon layer, and then patterning the crystalline silicon layer. The source area 23-1 and the drain area 23-3 of the active layer 23 are doped with impurities according to types of thin film transistors TFT such as a driving TFT or a switching TFT.

A gate electrode 25 is disposed on the gate insulating layer 24 corresponding to the active layer 23, and an interlayer insulating layer 26 is disposed on the gate insulating layer 24 covering the gate electrode 25.

A contact hole H1 is formed in the interlayer insulating layer 26 and the gate insulating layer 24, and a source electrode 27-1 and a drain electrode 27-2 are disposed on the interlayer insulating layer 26 and in the contact hole H1, in such a manner that the source electrode 27-1 and the drain electrode 27-2 respectively contact the source area 23-1 and the drain area 23-2.

The passivation layer 27 is disposed on the thin film transistor TFT, and a pixel electrode 28-1 of an organic light-emitting device (OLED) 28 is disposed on the passivation layer 27. The pixel electrode 28-1 contacts the drain electrode 27-2 of the thin film transistor TFT through a via hole H2 formed in the passivation layer 27. The passivation layer 27 may include an inorganic material and/or an organic material, and may be a single layer or at least two layers. The passivation layer 27 may be a planarization layer configured to provide a flat surface over the layers disposed under the passivation layer 27 or may be disposed along the surface of the layers disposed under the passivation layer 27. The passivation layer 27 may include a transparent insulator to provide a resonance effect.

A pixel-defining layer 29 including an organic material and/or an inorganic material may be disposed to cover the pixel electrode 28-1 and the passivation layer 27, and to expose the pixel electrode 28-1. An intermediate layer 28-2 and an opposite electrode 28-3 are disposed on the exposed pixel electrode 28-1.

The pixel electrode 28-1 may function as an anode electrode, and the opposite electrode 28-3 may function as a cathode electrode. However, polarities of the pixel electrode 28-1 and the opposite electrode 28-3 may be changed.

The intermediate layer 28-2 may include an organic emission layer. The intermediate layer 28-2 may include the organic emission layer and further include at least one of a hole injection layer (HIL), a hole transport layer (HTL), an electron transport layer (ETL), and an electron injection layer (HIL). However, the exemplary embodiments are not limited thereto. The intermediate layer 28-2 may include the organic emission layer and may further include various functional layers.

The pixel electrode 28-1 and the opposite electrode 28-3 may be insulated from each other by an the intermediate layer 28-2, and an the organic emission layer is configured to emits light by applying voltages having different polarities to the intermediate layer 28-2.

The intermediate layer 28-2 may be formed using the apparatus for manufacturing a display apparatus illustrated in FIG. 6.

One unit pixel includes at least one sub-pixel, and when more than one sub-pixel is employed, the sub-pixels may emit various colors of light. For example, each of the at least one sub-pixels may respectively emit red light, green light, and blue light or may respectively emit red light, green light, blue light, and white light.

The thin-film encapsulation layer E may include inorganic layers or may include an inorganic layer and an organic layer. The organic layer of the thin-film encapsulation layer E may include a polymer, and may include at least one layer including polyethylene terephthalate, PI, polycarbonate, epoxy, polyethylene, and polyacrylate. The organic layer including polyacrylate may include a polymerized monomer composite including diacrylate-based monomer and a triacrylate-based monomer. The monomer composite may further include a monoacrylate-based monomer. However, the exemplary embodiments are not limited thereto, and the monomer composite may further include any well-known photo initiator such as TPO. The inorganic layer of the thin-film encapsulation layer E may include at least one layer including a metal oxide or a metal nitride. For example, the inorganic layer may include at least one of $SiN_x$, $Al_2O_3$, $SiO_2$, and $TiO_2$.

An uppermost layer of the thin film encapsulation layer E exposed to the outside may be an inorganic layer in order to reduce or prevent moisture from penetrating into the OLED.

The thin-film encapsulation layer E may have at least one sandwich structure including at least one organic layer disposed between at least two inorganic layers. The thin-film encapsulation layer E may include at least one sandwich structure including at least one inorganic layer disposed between at least two organic layers. The thin-film encapsulation layer E may include a sandwich structure including at least one organic layer disposed between at least two inorganic layer, and a sandwich structure including at least one inorganic layer disposed between at least two organic layers.

The thin-film encapsulation layer E may include a first inorganic layer, a first organic layer, and a second inorganic layer sequentially stacked from an upper surface of the OLED.

The thin-film encapsulation layer E may include a first inorganic layer, a first organic layer, a second inorganic layer, a second organic layer, and a third inorganic layer sequentially stacked from the upper surface of the OLED.

The thin-film encapsulation layer E may include a first inorganic layer, a first organic layer, a second inorganic layer, a second organic layer, a third inorganic layer, a third organic layer, and a fourth inorganic layer sequentially stacked from the upper surface of the OLED.

A halogenated metallic layer including lithium fluoride LiF may be further disposed between the OLED and the first inorganic layer. The halogenated metallic layer may reduce or prevent damage of the OLED when the first inorganic layer is formed using a sputtering method.

The first organic layer may have a smaller area than the second inorganic layer, and the second organic layer may have a smaller area than the third inorganic layer.

Therefore, the display apparatus 20 may include the intermediate layer 28—having an improved pattern, and since the intermediate layer 28-2 has an improved pattern, the display apparatus 20 may produce an image having improved accuracy. Also, the intermediate layer 28-2 including multiple layers sequentially deposited may have pattern with improved consistency, the display apparatus 20 may generate images having improved quality.

According to an apparatus and method of manufacturing a display apparatus according to the one or more exemplary embodiments, the deposition material may be deposited having a deposition pattern with improved accuracy. Also, according to the apparatus and method of manufacturing a display apparatus according to the one or more exemplary embodiments, a display apparatus that may produce images having improved accuracy may be manufactured.

In addition, a mask sheet affixed to a mask frame according to one or more exemplary embodiments may have a pattern of openings having reduced deformation.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mask assembly comprising:
   a mask frame; and
   a mask sheet disposed on the mask frame, the mask sheet comprising:
      a pattern comprising a plurality of openings; and
      a step structure disposed on an edge region of the pattern,
   wherein the mask sheet is stretched by applying tensile force and affixed onto the mask frame, and
   wherein the step structure has a first thickness and a second thickness different from the first thickness, the first thickness and the second thickness are greater than a thickness of the pattern and smaller than a thickness of portions of the mask sheet other than the patter and the step structure.

2. The mask assembly of claim 1, wherein the pattern and the step structure are connected to each other.

3. The mask assembly of claim 1, wherein the step structure comprises a plurality of stepped structures, each of the plurality of stepped structures connected to each other, and
   thicknesses of the plurality of stepped structures increase with increasing distance from the pattern.

4. An apparatus for manufacturing a display apparatus, the apparatus comprising:
 a mask assembly disposed facing a substrate; and
 a deposition source disposed facing the mask assembly,
 wherein the mask assembly comprises:
 a mask frame; and
 a mask sheet disposed on the mask frame, the mask sheet comprising:
  a pattern comprising a plurality of openings; and
  a step structure disposed on an edge region of the pattern,
 wherein the mask sheet is stretched by applying tensile force and affixed onto the mask frame, and
 wherein the step structure has a first thickness and a second thickness different from the first thickness, the first thickness and the second thickness are greater than a thickness of the pattern and smaller than a thickness of portions of the mask sheet other than the pattern and the step structure.

5. The apparatus of claim 4, wherein the pattern and the step structure are stepped and connected to each other.

6. The apparatus of claim 4, wherein
 thicknesses of the step structure increase with increasing distance from the pattern.

7. A method of manufacturing a display apparatus, comprising:
 transferring a substrate and a mask assembly into a chamber;
 aligning the substrate and the mask assembly relative to each other; and
 depositing a deposition material onto the substrate, wherein the deposition material is provided from a deposition source facing the mask assembly, and the deposition material is deposited through the mask assembly,
 wherein the mask assembly comprises a mask frame and a mask sheet disposed on the mask frame, the mask sheet comprising: a pattern comprising a plurality of openings; and a step structure disposed on an edge region of the pattern,
 wherein the mask sheet is stretched by applying tensile force and affixed onto the mask frame, wherein a thickness of the pattern is smaller than thicknesses of other portions of the mask sheet, and
 wherein a thickness of the pattern is smaller that thicknesses of other portions of the mask sheet, and
 wherein the aligning the substrate and the mask assembly comprises disposing the mask assembly so that the step structure is facing the deposition material.

8. The method of claim 7,
 wherein the step structure and the other portions of the mask sheet have different thicknesses from each other.

9. The method of claim 8, wherein the thickness of the pattern is less than a thickness of the step structure.

10. The method of claim 8, wherein the pattern and the step structure are stepped and connected to each other.

11. The method of claim 8, wherein the step structure comprises a plurality of stepped structures, each of the plurality of stepped structures connected to each other, and thicknesses of the plurality of stepped structures increase with increasing distance from the pattern.

12. The method of claim 7, wherein the step structure has a first thickness and a second thickness different from the first thickness, the first thickness and the second thickness are greater than a thickness of the pattern and smaller than a thickness of portions of the mask sheet other than the pattern and the step structure.

* * * * *